(12) United States Patent
Petrat et al.

(10) Patent No.: US 8,907,333 B2
(45) Date of Patent: Dec. 9, 2014

(54) PYROGENIC ZINC OXIDE-COMPRISING COMPOSITE OF LAYERS AND FIELD-EFFECT TRANSISTOR COMPRISING THIS COMPOSITE

(75) Inventors: Frank-Martin Petrat, Muenster (DE); Heiko Thiem, Haltern am See (DE); Sven Hill, Aschaffenburg (DE); Andre Ebbers, Bochum (DE); Koshi Okamura, Karlsruhe (DE); Roland Schmechel, Darmstadt (DE)

(73) Assignees: Evonik Degussa GmbH, Essen (DE); Forschungszentrum Karlsruhe GmbH, Eggenstein-Leopoldshafen (DE)

( * ) Notice: Subject to any disclaimer, the term of this patent is extended or adjusted under 35 U.S.C. 154(b) by 462 days.

(21) Appl. No.: 12/596,150

(22) PCT Filed: Mar. 10, 2008

(86) PCT No.: PCT/EP2008/052820
§ 371 (c)(1),
(2), (4) Date: Oct. 16, 2009

(87) PCT Pub. No.: WO2008/128821
PCT Pub. Date: Oct. 30, 2008

(65) Prior Publication Data
US 2010/0132788 A1 Jun. 3, 2010

(30) Foreign Application Priority Data
Apr. 19, 2007 (DE) .................. 10 2007 018 431

(51) Int. Cl.
*H01L 21/00* (2006.01)
*H01L 21/16* (2006.01)
*H01L 21/3205* (2006.01)
*H01L 29/786* (2006.01)

(52) U.S. Cl.
CPC ...... *H01L 21/32055* (2013.01); *H01L 29/7869* (2013.01)
USPC ............. 257/43; 257/E21.459; 257/E21.461; 257/E21.464; 438/478; 438/479; 438/500; 438/502

(58) Field of Classification Search
USPC ......................... 438/478, 479, 502
See application file for complete search history.

(56) References Cited

U.S. PATENT DOCUMENTS

| 2003/0218221 A1 | 11/2003 | Wager et al. |
| 2003/0218222 A1 | 11/2003 | Wager et al. |

(Continued)

FOREIGN PATENT DOCUMENTS

| WO | 2004 014800 | 2/2004 |
| WO | 2006 008175 | 1/2006 |

OTHER PUBLICATIONS

U.S. Appl. No. 13/123,072, filed Apr. 7, 2011, Thiem, et al.

(Continued)

*Primary Examiner* — Colleen A Matthews
*Assistant Examiner* — William Harriston
(74) *Attorney, Agent, or Firm* — Oblon, Spivak, McClelland, Maier & Neustadt, L.L.P.

(57) ABSTRACT

Composite of layers which comprises a dielectric layer and a layer which comprises pyrogenic zinc oxide and is bonded to the dielectric layer. Process for producing the composite of layers, in which the pyrogenic zinc oxide is applied to the dielectric layer in the form of a dispersion in which the zinc oxide particles are present with a mean aggregate diameter of less than 200 nm, and the zinc oxide layer is dried and then treated at temperatures of less than 200° C. Process for producing the composite of layers, in which the pyrogenic zinc oxide is applied to a substrate layer or a composite of substrate layers in the form of a dispersion in which the zinc oxide particles are present with a mean aggregate diameter of less than 200 nm to form a zinc oxide layer, and then the zinc oxide layer and the substrate layer are treated at temperatures of less than 200° C., and then a dielectric layer is applied to the zinc oxide layer. Field-effect transistor which has the composite of layers.

15 Claims, 3 Drawing Sheets

(56) References Cited

U.S. PATENT DOCUMENTS

| | | |
|---|---|---|
| 2005/0017302 A1 | 1/2005 | Hoffman |
| 2005/0182174 A1* | 8/2005 | Michael et al. ............... 524/430 |
| 2006/0073902 A1 | 4/2006 | Sekine |
| 2006/0292777 A1* | 12/2006 | Dunbar ......................... 438/197 |
| 2007/0037699 A1* | 2/2007 | Katusic et al. ................ 502/323 |
| 2007/0093004 A1* | 4/2007 | Park et al. .................... 438/149 |
| 2007/0141784 A1 | 6/2007 | Wager et al. |
| 2007/0267699 A1 | 11/2007 | Hoffman |
| 2011/0309313 A1 | 12/2011 | Steiger et al. |
| 2011/0315982 A1 | 12/2011 | Hoppe et al. |
| 2012/0181488 A1 | 7/2012 | Steiger et al. |
| 2012/0202318 A1 | 8/2012 | Steiger et al. |
| 2012/0213980 A1 | 8/2012 | Arning et al. |
| 2012/0289728 A1 | 11/2012 | Steiger et al. |
| 2013/0104773 A1 | 5/2013 | Steiger et al. |
| 2013/0116463 A1 | 5/2013 | Steiger et al. |
| 2013/0122647 A1 | 5/2013 | Steiger et al. |

OTHER PUBLICATIONS

U.S. Appl. No. 13/884,495, filed May 9, 2013, Steiger, et al.

* cited by examiner

PYROGENIC ZINC OXIDE-COMPRISING COMPOSITE OF LAYERS AND FIELD-EFFECT TRANSISTOR COMPRISING THIS COMPOSITE

BACKGROUND OF THE INVENTION

1. Field of the Invention

The invention relates to a pyrogenic zinc oxide-comprising composite of layers and to a field-effect transistor comprising this composite. The invention further relates to processes for producing the composite.

2. Discussion of the Background

The use of zinc oxide (ZnO) as a semiconductor material in field-effect transistors is described in the literature. For instance, it has been known for some time that layers deposited from the gas phase, for example via CVD, PE-CVD or atom beam epitaxy, have remarkable properties in field-effect transistors.

A disadvantage in these processes is the necessity of costly vacuum systems, which prevents their use in the field of printed electronics.

Also known in this connection is the use of colloidal systems with different particle morphologies. The layers thus produced form the so-called channel, in which, by applying a voltage at the so-called gate, charge carriers are induced, which are required for the transport of current in the switched-on state.

A disadvantage of these systems is that the zinc oxide layers have to be heat-treated at high aftertreatment temperatures in order to achieve a sufficient field-effect mobility ($\mu_{FET}$). The temperatures are typically in the region of at least 200° C., in many cases even higher than 300° C.

SUMMARY OF THE INVENTION

It was therefore an object of the present invention to provide a system which, even at low aftertreatment temperatures, has good semiconductive properties in the sense of field-effect mobility and on/off ratio.

It was a further object of the invention to provide a process for producing such a system. The process should especially contribute to lowering the costs for the production of mass-printed circuits.

The invention provides a composite of layers which comprises a dielectric layer and a layer which comprises pyrogenic zinc oxide and is bonded to the dielectric layer.

DETAILED DESCRIPTION OF THE INVENTION

A composite is understood to mean layers bonded to one another in a fixed manner.

The dielectric layer comprises inorganic and organic materials. Inorganic materials may, for example, be silicon dioxide, aluminium oxide, silicon-titanium mixed oxides, which may also be present in surface-modified form. Known surface modifiers are, for example, hexamethyldisilazane or octadecyltrichlorosilane.

Organic materials may, for example, be polymeric systems, for example poly(perfluoroethylene-co-butenyl vinylether), polypropylene-co-butene, polyvinylphenol (PVP), polymethyl acrylate (PMMA), PVP-co-PMMA, polypropylene (PP), polyiso-butylene or polystyrene (PS).

A pyrogenic zinc oxide is understood to mean one which is formed by oxidation of zinc or of a zinc compound in a flame. The flame itself results from the reaction of a hydrogenous combustion gas with an oxygen-containing gas. This preferably involves a hydrogen/oxygen flame. Possibly, the advantageous properties of the pyrogenic zinc oxide in the present invention are attributable to the high temperatures during the production process. At the same time, the particles are exposed to the high temperatures only briefly. The residence time of the oxidation zone of the reactor is generally from 5 to 200 milliseconds. Subsequently, the particles are cooled with a cooling rate between 1000 Kelvin/second and 50 000 Kelvin/second. The pyrogenic zinc oxide is present in the form of aggregated primary particles and usually has a BET surface area of 10 to 200 m$^2$/g.

The pyrogenic zinc oxide may also be present in doped form. Suitable dopant components may, for example, be aluminium, gallium, indium, antimony, niobium, tin, lanthanum, magnesium, fluorine, lithium, bismuth, silicon, germanium or titanium. The dopant components may be present in homogeneous distribution in the primary particles of zinc oxide or be present enriched at the surface of the primary particles of zinc oxide or be present partly in the form of clusters, either within the volume of the particles or enriched at the surface. The proportion of the dopant components, based on zinc oxide, is preferably 0.0005 to 10% by weight, more preferably between 0.0005 and 5% by weight. Through the degree of doping, it is possible, as known in semiconductor electronics, to vary the properties of an electronic component within wide limits.

The thickness of the layer comprising pyrogenic zinc oxide is not restricted. In general, it is 10 nm to 10 μm. Particular preference may be given to a range of 10 to 500 nm.

The pyrogenic zinc oxide is bonded to a dielectric layer. The thickness of the dielectric layer is preferably 50 nm to 1 μm. Particular preference is given to a range of 100 to 500 nm.

The dielectric layer itself can in turn be applied on a layer, for example polymer films of PET, or a doped or undoped silicon wafer.

The layer comprising the pyrogenic zinc oxide may likewise be applied on a layer, for example polymer films of PET, or a doped or undoped silicon wafer.

Particular preference is given to a composite in which the layer comprising pyrogenic zinc oxide is 10 to 500 nm thick, and the dielectric layer has a thickness of 10 to 500 nm.

Preferably, the layer comprising pyrogenic zinc oxide does not comprise any further metal oxide particles apart from them.

It has also been found that the layer comprising the pyrogenic zinc oxide may also comprise organic fractions. These organic constituents are typically (co)polymers which originate from the application of the zinc oxide-containing layer. In general, it is advantageous to keep the organic fraction as low as possible. However, even with organic fractions of up to 15% by weight, based on zinc oxide, acceptable semiconductor properties are obtained.

The invention further provides a process for producing the composite of layers, in which the pyrogenic zinc oxide is applied to the dielectric layer in the form of a dispersion in which the zinc oxide particles are present with a mean aggregate diameter of less than 200 nm to form a zinc oxide layer on the dielectric layer, and then the zinc oxide layer and dielectric layer are treated at temperatures of less than 200° C.

The invention further provides a process for producing the composite of layers, in which the pyrogenic zinc oxide is applied in the form of a dispersion in which the zinc oxide particles are present with a mean aggregate diameter of less than 200 nm to form a zinc oxide layer on a substrate layer or a composite of substrate layers, and then the zinc oxide layer and the substrate layer are treated at temperatures of less than 200° C. and then a dielectric layer is applied to the zinc oxide layer.

The above-described processes also include the possibility of applying electrodes to the layers present in the composite.

For the application of the dispersion, the methods known to those skilled in the art are available. Examples include dip-coating, spin-on coating, inkjet coating, flexographic printing, offset printing, gravure printing or screen-printing. The dispersion can be applied more than once, both before the drying step and before the thermal treatment step.

After the application of the dispersion and before the thermal treatment, a drying step can be inserted. Drying is understood to mean that the zinc oxide layer obtained after the application of the dispersion is left to stand at room temperature or at temperatures up to 50° C. over a period of 1-24 hours. In the course of this, a majority of the liquid phase of the dispersion has evaporated. The period is dependent primarily on the temperature selected.

The process according to the invention is notable in that the thermal treatment of the zinc oxide layer is effected at low temperatures, less than 200° C. A preferred range has been found to be that of 80 to 180° C. and a particularly preferred range that of 100 to 150° C. The low temperatures also allow the application of pyrogenic zinc oxide on thermally sensitive, organic substrates.

The duration of the thermal treatment should be determined by preliminary tests. According to the drying unit used, for example infrared field or intensive dryer, the duration of the thermal treatment is between a few seconds and a few minutes. In general, 1 to 60 s are sufficient.

It has been found that the mean aggregate diameter of the zinc oxide particles in the dispersion is critical. It has been found that useful electronic components can be obtained only when the mean aggregate diameter of the particles is 200 nm or less. The mean aggregate diameter is preferably 70 to 200 nm and more preferably 90 to 180 nm. In the context of this invention, mean aggregate diameter is understood to mean the number-average $d_{50}$ value. To achieve such an aggregate size, dispersion units which ensure a sufficient high energy input are required. This should be at least 200 kJ/m$^3$. These include systems according to the rotor-stator principle, for example Ultra-Turrax machines, ultrasound or stirred ball mills. Higher energy inputs are possible with a planetary kneader/mixer. However, the effectiveness of this system is associated with a sufficiently high viscosity of the mixture processed in order to introduce the high shear energies required to comminute the particles. High-pressure homogenizers can afford particularly fine dispersions. In this apparatus, two predispersed streams under high pressure are decompressed through a nozzle. The two dispersion jets meet one another exactly and the particles grind themselves. In another embodiment, the predispersion is likewise placed under high pressure, except that the particles collide against armoured wall regions. The operation can be repeated as often as desired in order to obtain smaller particle sizes. The dispersion apparatus can also be used in combination. Before the further use, the dispersion can be filtered once again in order to remove any coarse particles present.

The proportion of the zinc oxide particles in the dispersion is not limited. It is usually in a range of 5 to 60% by weight, based on the dispersion. The proportion of zinc oxide particles in the dispersion is preferably 10 to 50% by weight.

The type of zinc oxide particles used is not restricted, provided that they are produced pyrogenically. In particular, the zinc oxides disclosed in the applications DE-A-10343728, U.S. Pat. No. 6,335,002, DE-A-10212680, DE-A-10235758 or EP-A-598284 can be used.

It is possible with preference to use zinc oxide particles in which the aggregates are formed from particles with different morphology. Such zinc oxide particles are disclosed in DE-A-10343728, in which the aggregates are present in a circular form to an extent of 0-10%, in an ellipsoidal form to an extent of 30-50%, in a linear form to an extent of 30-50%, and in a branched form to an extent of 20-30%. Apparently, pyrogenic zinc oxide particles with such an aggregate structure are particularly suitable for the production of the composite according to the invention.

The dispersion may further comprise substances which stabilize the dispersion against reagglomeration and sedimentation. In general, these substances, depending on the type, the zinc oxide concentration and the type of liquid phase of the dispersion may be present in aqueous or organic form with a proportion of 0.01 to 20% by weight based on the zinc oxide present in the dispersion. In general, a relatively low proportion of these substances will be pursued, since this can have positive effects on the performance of the electronic components. Suitable substances are, for example:

a styrene oxide-based polyalkylene oxide with random distribution or a block copolymer of the general formula 1, $$R^1O(SO)_a(EO)_b(PO)_c(BO)_dR^2 \quad (1)$$

where $R^1$=a linear or branched or cycloaliphatic radical having 8 to 13 carbon atoms

$R^2$=hydrogen, an acyl radical, alkyl radical or carboxylic acid radical having in each case 1 to 8 carbon atoms, SO=styrene oxide, EO=ethylene oxide, PO=propylene oxide, BO=butylene oxide and a=1 to 5, b=3 to 50, c=0 to 3, d=0 to 3, and b≥a+c+d.

Compounds with a=1 to 1.9 are described for example in EP-A-1078946.

It is also possible to use a phosphoric ester of the general formula 2, (2)

-continued where R = where
x is 1 or 2,
n is a number from 2 to 18
m and o are each a number from 2 to 100,
k is a number from 2 to 4,
R" is H or a linear or branched alkyl radical, which optionally may be substituted by additional functional groups, and
R' is an alkyl, alkaryl, alkenyl or sulphopropyl radical.

Compounds used with preference are described for example in EP-A-940406.

It is also possible to use block copolymers and their salts of the general formula 3, $$[R^1O(SO)_a(EO)_b(CH_2CHCH_3O)_c(BO)_d]_xP(=O)(OH)_{3-x} \quad 3$$

where $R^1$=a linear, branched or cycloaliphatic radical having 1 to 22 carbon atoms, SO=styrene oxide, EO=ethylene oxide, BO=butylene oxide and a=1 to <2, b=0 to 100, c=0 to 10, d=0 to 3, and b≥a+c+d.

It is also possible to use compounds which are obtainable by the partial or complete reaction of A) one or more amino-functional polymers with
B) one or more polyesters of the general formulae (4)/(4a)

$$T\text{-}C(O)\text{—}[O\text{-}A\text{-}C(O)]_x\text{—}OH \quad (4),$$

$$T\text{-}O\text{—}[C(O)\text{-}A\text{-}O]_y\text{—}Z \quad ((4a)$$

and

C) one or more polyethers of the general formula (5)/(5a)

$$T\text{-}C(O)\text{—}B\text{—}Z \quad (5),$$

$$T\text{-}O\text{—}B\text{—}Z \quad (5a),$$

in which

T is a hydrogen radical and/or an optionally substituted, linear or branched aryl, arylalkyl, alkyl or alkenyl radical having 1 to 24 carbon atoms, A is at least one divalent radical selected from the group of linear, branched, cyclic and aromatic hydrocarbons, Z is at least one radical selected from the group of sulphonic acids, sulphuric acids, phosphoric acids, phosphoric acids, carboxylic acids, isocyanates, epoxides, in particular of phosphoric acid and (meth)acrylic acid, B is a radical of the general formula (6)

$$\text{—}(C_lH_{2l}O)_a\text{—}(C_mH_{2m}O)_b\text{—}(C_nH_{2n}O)_c\text{—}(SO)_d\text{—} \quad (6)$$

a,b,c independently of one another are values from 0 to 100, with the proviso that the sum of a+b+c≥0, preferably 5 to 35, in particular 10 to 20, with the proviso that the sum of a+b+c+d>0, d is ≥0, preferably 1 to 5, l, m, and n independently of one another are each ≥2, preferably 2 to 4, and x and y independently of one another are ≥2.

It is also possible to use an organopolysiloxane of the general formula 7 where the radicals $R^1$ are alkyl radicals having 1 to 4 carbon atoms or aryl radicals, but at least 80% of the radicals $R^1$ are methyl radicals, $R^2$ are identical or different in the molecule and can have the following definitions:

a)

in which $R^3$ is a hydrogen or alkyl radical, $R^4$ is a hydrogen, alkyl or carboxyl radical, c is a number from 1 to 20, d is a number from 0 to 50, e is a number from 0 to 50, or b) $—(CH_2—)_fOR^5$ in which $R^5$ is a hydrogen, alkyl, carboxyl radical or a dimethylolpropane radical optionally containing ether groups, f is a number from 2 to 20, or c) $—(CH_2—)_g(OC_2H_4—)_h(OC_3H_6—)_i(OC_4H_8)_j(OCH_2CH(C_6H_5))_kOR^6$ in which $R^6$ is a hydrogen, alkyl or carboxyl radical, g is a number from 2 to 6, h is a number from 0 to 20, i is a number from 1 to 50, j is a number from 0 to 10, k is a number from 0 to 10 or d) corresponds to the radical $R^1$, with the proviso that in the average molecule at least one radical $R^2$ has the definition (a), a being a number from 1 to 500, preferably from 1 to 200 and in particular 1 to 50 and b being a number from 0 to 10, preferably <5 and in particular 0.

Compounds of this kind are described for example in EP-A-1382632.

It is also possible to use copolymers based on styrene oxide-based oxyalkylene glycol alkenyl ethers or polyalkylene oxide alkenyl ethers and unsaturated carboxylic acid, preferably dicarboxylic acid derivatives, with a) 1 to 80 mol % of at least one of the constituent groups of the formula 8a, 8b, 8c and/or 8d in which $R^1$=H, aliphatic hydrocarbon radical having 1 to 5 carbon atoms, p=1-4, q=0-6, t=0-4, i=1-6, l=1-2, m=2-18, the index on the H atom being formed by the product of l and m, n=0-100, o=0-100, SO=styrene oxide, it being possible for $(SO)_i$ and the alkylene oxide derivatives to be distributed randomly or blockwise in the polyether, but preferably the groups are in blockwise construction and follow the sequence $R^2$=H, an aliphatic, optionally branched hydrocarbon radical having 1 to 20 carbon atoms, a cycloaliphatic hydrocarbon having 5 to 8 carbon atoms, an aryl radical having 6 to 14 carbon atoms, which is optionally substituted or may be a phosphoric ester (preferably monoester) derivative, sulphate derivative or sulphonate derivative;

b) 1 to 90 mol % of constituent groups of the formula 9 where

S=—H, —$COOM_a$, —$COOR^3$,

M=hydrogen, monovalent or divalent metal cation, ammonium ion, organic amine radical, a=1 or if M is a divalent metal cation, is ½, $R^3$=an aliphatic, optionally branched hydrocarbon radical having 1 to 20 carbon atoms, a cycloaliphatic hydrocarbon having 5 to 8 carbon atoms, an aryl radical having 6 to 14 carbon atoms, where

$Q^1$ is a divalent alkylene radical having 2 to 24 carbon atoms, $Q^2$ and $Q^3$ are aliphatic and/or alicyclic alkyl radicals having 1 to 12 carbon atoms, optionally oxidized to -$Q^1$-$N^{(+)}O^{(-)}Q^2Q^3$ and m, n, l, o, $R^1$ and $R^2$ are as defined above, c) 0 to 10 mol % of constituent groups of the formula 10 where in which $U^2$=OOC—, —NHOC—, —O—, —O—$CH_2$—, and m, n, l, o, S, $R^1$, $R^2$ and $U^1$ are as defined above.

Compounds of this kind are described for example in DE-A-10348825.

It is also possible to use polyacrylic acids having an $M_w$ of preferably 200 to 2 000 000 g/mol, more preferably an $M_w$ of 1000 to 50 000 g/mol, and salts thereof.

The dispersion may be either aqueous or organic, or consist of a mixture which has water and organic solvent as a liquid phase, only a single liquid phase being present in all cases. "Aqueous" is understood to mean that the predominant proportion of the liquid phase consists of water. "Organic" is understood to mean that the liquid phase consists predominantly or exclusively of at least one organic solvent. Suitable organic solvents may be ethanol, methanol, propanol, butanol, acetone, ethyl acetate, butyl acetate, alkanes and/or ethers.

Preference is given in the context of the invention to an aqueous dispersion or a dispersion based on butyl acetate.

The invention further provides a field-effect transistor which comprises the inventive composite of layers.

In particular, the field-effect transistor comprises a gate contact, a source contact, a drain contact, and a channel region present between source contact and drain contact, the channel region being the part of the inventive composite of layers which comprises pyrogenic zinc oxide.

The field-effect transistor according to the present invention preferably has a mobility of at least $2 \cdot 10^{-3}$ cm$^2$/V·s.

The invention further provides a process for producing a field-effect transistor, which comprises the steps of:

a1) providing a substrate layer
a2) mounting a source electrode and drain electrode
a3) applying pyrogenic zinc oxide to the substrate layer having source and drain electrodes
a4) applying a dielectric layer on the zinc oxide layer
a5) mounting a gate electrode on the dielectric layer
or
b1) providing a substrate layer
b2) mounting a gate electrode
b3) applying a dielectric layer on the substrate layer comprising the gate electrode
b4) mounting a source electrode and drain electrode on the dielectric layer
b5) applying pyrogenic zinc oxide to the dielectric layer having source and drain electrodes
or
c1) providing a substrate layer
c2) applying pyrogenic zinc oxide to the substrate layer having source and drain electrodes
c3) mounting a source electrode and drain electrode on the layer comprising pyrogenic zinc oxide
c4) applying a dielectric layer on the zinc oxide layer having source and drain electrodes
c5) mounting a gate electrode on the dielectric layer
or
d1) providing a substrate layer
d2) mounting a gate electrode
d3) applying a dielectric layer on the substrate layer comprising the gate electrode
d4) applying pyrogenic zinc oxide to the dielectric layer having the gate electrode
d5) mounting a source electrode and drain electrode on the layer comprising pyrogenic zinc oxide
wherein the pyrogenic zinc oxide is applied in each case in the form of a dispersion in which the zinc oxide particles are present with a mean aggregate diameter of less than 200 nm, and the layers are treated at temperatures of less than 200° C.

Figure 1A:
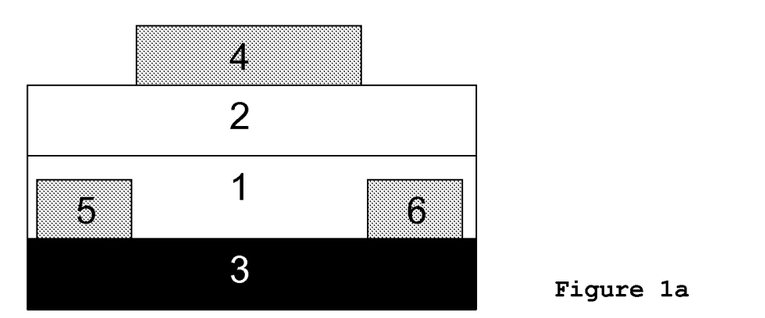
FIG. 1a schematically shows the structure of a field-effect transistor produced by a process comprising the steps of a1)-a5).
Figure 1B:
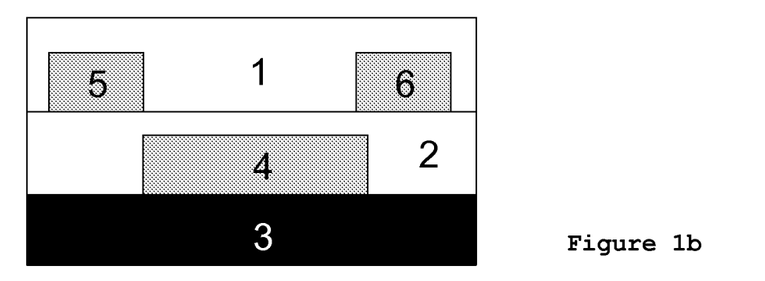
FIG. 1b schematically shows the structure of a field-effect transistor produced by a process comprising the steps of b1)-b5).
Figure 1C:
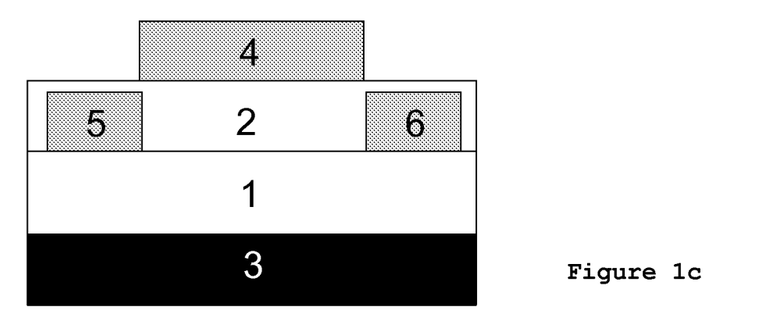
FIG. 1c schematically shows the structure of a field-effect transistor produced by a process comprising the steps of c1)-c5).
Figure 1D:
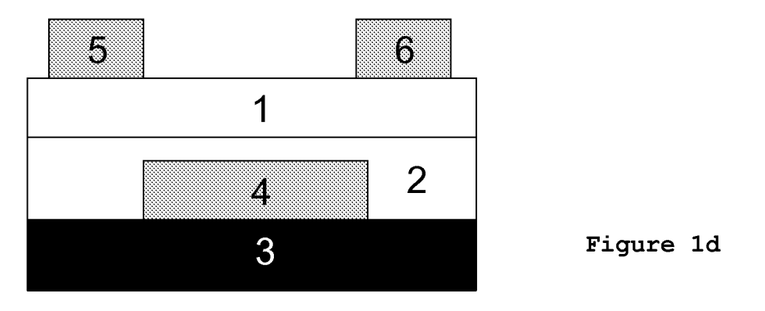
FIG. 1d schematically shows the structure of a field-effect transistor produced by a process comprising the steps of d1)-d5).

The structure of the field-effect transistor according to features a1-a5 is shown in FIG. 1a, that according to features b1-b5 in FIG. 1b, that according to features c1-c5 in FIG. 1c, and that according to features d1-d5 in FIG. 1d. In these figures: 1=layer comprising zinc oxide; 2=dielectric layer; 3=substrate; 4=gate; 5=source; 6=drain.

Useful materials for the substrate layer have been found to be polymer films, for example PET.

After the application of the dispersion and before the thermal treatment, a drying step can be inserted. The methods for the application of the dispersion, the drying conditions and the conditions for the thermal treatment, the type and the concentration of the zinc oxide particles used and the substances which can also be used are the same as described above for the production of the inventive composite of layers.

The invention further provides for the use of the inventive composite of layers for producing solar cells, displays, sensors, RFID tags.

EXAMPLES

Zinc oxide used: BET 25 m$^2$/g, corresponding to Example 3 from DE-A-10343728.

Dispersions used: Dispersions D1 and D2 are obtained by high-pressure homogenization of the above-described zinc oxide in water or n-butyl acetate at 2500 bar. The additives are added before or during the powder addition.

TABLE 1

| Dispersions used | | D1 | D2 |
|---|---|---|---|
| Liquid phase | | Water | n-Butyl acetate |
| Zinc oxide | % by wt.[1] | 34 | 35 |
| Polyacrylic acid[3] | % by wt.[2] | 1 | — |
| Tego Dispers 715 W | % by wt.[2] | 2 | — |
| Disperbyk 9077 | % by wt.[2] | — | 10 |
| Mean aggregate diameter $d_{50}$ | nm | 102 | 137 |

[1] based on the dispersion;
[2] based on ZnO;
[3] Na salt, $M_w$ = 2500 g/mol

Field-Effect Transistor (FET):

A doped silicon wafer with a specific resistance of 7-21 Ohm·cm is used. Its surface consists of a thermal silicon dioxide having a thickness of 250 nm. The wafer is treated by means of acetone and isopropanol in an ultrasound bath for 10 minutes in each case. Subsequently, a UV-ozone treatment is carried out for 3 minutes and an oxygen flow of 1 l/min. Subsequently, dispersion D1 is applied by means of spin-on in 2 stages (1st stage: 500 rpm, 10 s; 2nd stage: 2000 rpm, 30 s). Subsequently, drying is effected under air at a temperature of 90° C. over a period of 30 minutes.

Figure 2:
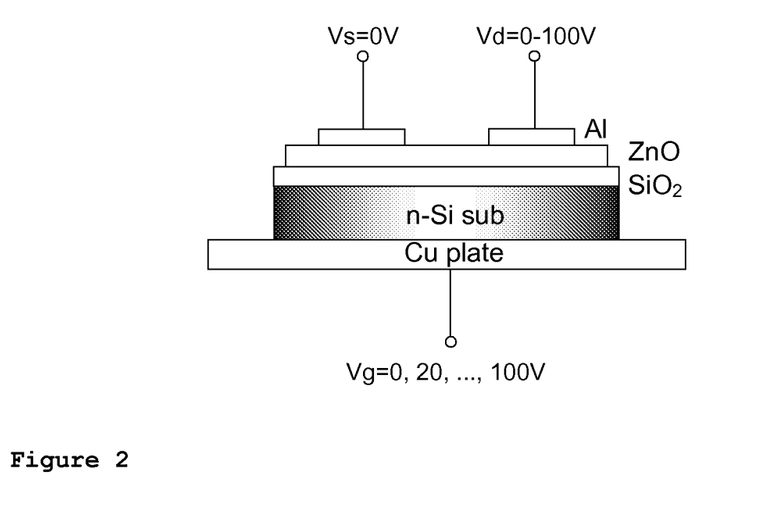
FIG. 2 shows the construction of a field-effect transistor with a pyrogenic zinc oxide applied in the form of dispersion D1.
Figure 3:
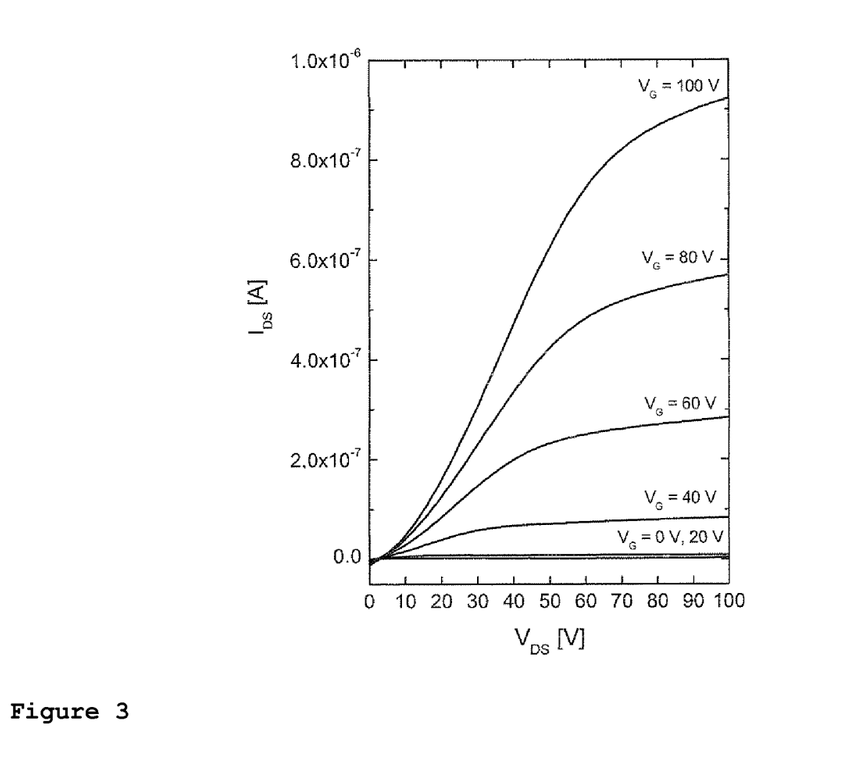
FIG. 3 shows the output characteristics of the field-effect transistor of FIG. 2.
Figure 4:
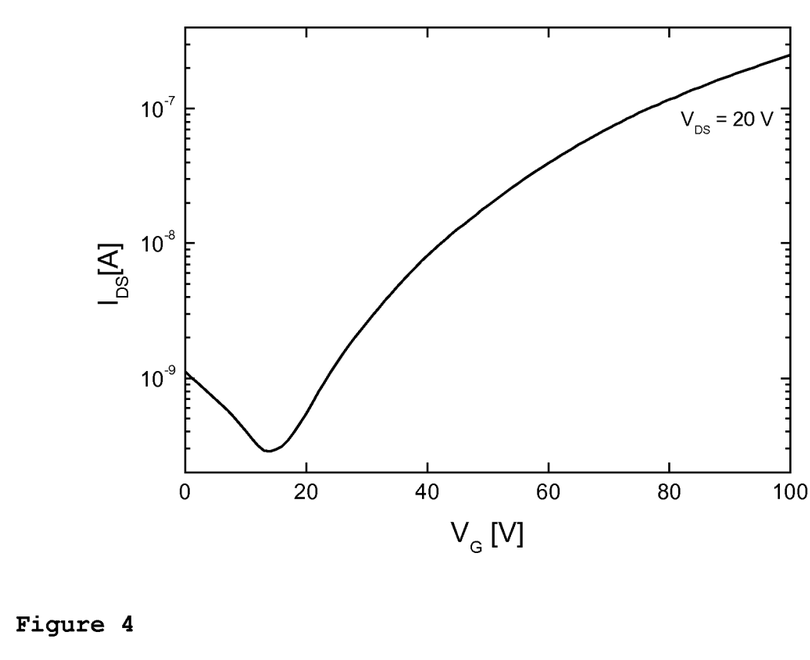
FIG. 4 shows the transmission characteristics of the field-effect transistor of FIG. 2.

The source and drain electrodes made of aluminium are applied through a shadowmask with a vapour deposition rate of 5 ångström/s. The wafer with the FET structure is contacted with the aid of a prober, the gate contact on the rear side being established via a copper sheet which is secured on the wafer with conductive silver. The construction is reproduced in FIG. 2 (conductive silver not shown). The transmission and output characteristics are recorded with the aid of a parameter analyzer (Agilent 4156 C). FIGS. 3, 4 show the output and transmission characteristics of the FET. The field-effect mobility is $2.5 \cdot 10^{-3}$ cm$^2$/Vs at a gate voltage $U_g$ of 80 V.

Correspondingly, a field-effect transistor can be obtained with dispersion D2. The resulting transistors exhibit similar behaviour to that from D1.

The invention claimed is:
1. A field-effect transistor, comprising:
a composite of layers, comprising:
a dielectric layer; and
a layer of aggregated pyrogenic zinc oxide primary particles bonded to the dielectric layer;
wherein
the aggregated pyrogenic zinc oxide primary particles are formed by oxidation of zinc or of a zinc compound in a flame;
a mean aggregate diameter of the aggregated particles is from 70 to 200 nm, and
the aggregates of the pyrogenic zinc oxide primary particles are of differing morphology, and comprise:
0 to 10% of a circular form;
30 to 50% of an ellipsoidal form;
30 to 50% of a linear form; and
20 to 30% of a branched form;
wherein the pyrogenic zinc oxide particles have a BET surface area of 10 to 200 m$^2$/g.
2. A process for producing the field-effect transistor according to claim 1, which comprises:
a1) providing a substrate layer,
a2) mounting a source electrode and drain electrode,
a3) applying pyrogenic zinc oxide particles to the substrate layer having source and drain electrodes,
a4) applying a dielectric layer on the zinc oxide layer, and a5) mounting a gate electrode on the dielectric layer
or
b1) providing a substrate layer,
b2) mounting a gate electrode,
b3) applying a dielectric layer on the substrate layer comprising the gate electrode,
b4) mounting a source electrode and drain electrode on the dielectric layer, and
b5) applying pyrogenic zinc oxide particles to the dielectric layer having source and drain electrodes
or
c1) providing a substrate layer,
c2) applying pyrogenic zinc oxide particles to the substrate layer,
c3) mounting a source electrode and drain electrode on the layer comprising pyrogenic zinc oxide,
c4) applying a dielectric layer on the zinc oxide layer having source and drain electrodes, and
c5) mounting a gate electrode on the dielectric layer
or
d1) providing a substrate layer,
d2) mounting a gate electrode,
d3) applying a dielectric layer on the substrate layer comprising the gate electrode,
d4) applying pyrogenic zinc oxide particles to the dielectric, layer having the gate electrode, and
d5) mounting a source electrode and drain electrode on the layer comprising pyrogenic zinc oxide particles,
wherein the pyrogenic zinc oxide is applied in each case in the form of a dispersion in which the zinc oxide particles are present with a mean aggregate diameter of from 70 to 200 nm, and the layers are treated at temperatures of less than 200° C.

3. The field-effect transistor according to claim 1, wherein the composite of layers is produced by:
applying the pyrogenic zinc oxide particles to the dielectric layer, as a dispersion in which the zinc oxide particles are present with a mean aggregate diameter of from 70 to 200 nm, to form a zinc oxide layer on the dielectric layer, and
then treating the zinc oxide layer and dielectric layer at temperatures of less than 200° C.

4. The field-effect transistor according to claim 1, wherein the composite of layers is produced by:
applying the pyrogenic zinc oxide particles to a substrate layer or a composite of substrate layers, as a dispersion in which the zinc oxide particles are present with a mean aggregate diameter of from 70 to 200 nm, to form a zinc oxide layer on the substrate layer,
treating the zinc oxide layer and the substrate layer at temperatures of less than 200° C., and
applying a dielectric layer is applied to the treated zinc oxide layer.

5. The field-effect transistor according to claim 3, wherein the dispersion is applied by dip-coating, spin-on coating, inkjet coating, flexographic printing, offset printing, gravure printing or screen-printing.

6. The field-effect transistor according to claim 3, wherein the thermal treatment takes place at 80 to 180° C.

7. The field-effect transistor according to claim 3, wherein a mean aggregate diameter of the zinc oxide particles is 90 to 180 nm.

8. The field-effect transistor according to claim 3, wherein a proportion of pyrogenic zinc oxide particles in the dispersion is 5 to 60% by weight.

9. The field-effect transistor according to claim 3, wherein the dispersion further comprises 0.01 to 20% by weight, based on zinc oxide, of one or more stabilizing additives.

10. The field-effect transistor according to claim 4, wherein the dispersion is applied by dip-coating, spin-on coating, inkjet coating, flexographic printing, offset printing, gravure printing or screen-printing.

11. The field-effect transistor according to claim 4, wherein the thermal treatment takes place at 80 to 180° C.

12. The field-effect transistor according to claim 4, wherein an aggregate diameter of the zinc oxide particles is 90 to 180 nm.

13. The field-effect transistor according to claim 4, wherein a proportion of pyrogenic zinc oxide particles in the dispersion is 5 to 60% by weight.

14. The field-effect transistor according to claim 4, wherein the dispersion further comprises 0.01 to 20% by weight, based on zinc oxide, of one or more stabilizing additives.

15. An RFID tag: comprising:
a composite of layers, comprising:
a dielectric layer; and
a layer of aggregated pyrogenic zinc oxide primary particles bonded to the dielectric layer;
wherein
the aggregated pyrogenic zinc oxide primary particles are formed by oxidation of zinc or of a zinc compound in a flame;
a mean aggregate diameter of the aggregated particles is from 70 to 200 nm, and
the aggregates of the pyrogenic zinc oxide primary particles are of differing morphology, and comprise:
0 to 10% of a circular form:,
30 to 50% of an ellipsoidal form;
30 to 50% of a linear form; and
20 to 30% of a branched form;
wherein the pyrogenic zinc oxide particles have a BET surface area of 10 to 200 $m^2/g$.

* * * * *